United States Patent [19]

Moulton

[11] Patent Number: 4,980,654

[45] Date of Patent: Dec. 25, 1990

[54] TRANSMISSION LINE TRANSFORMER

[75] Inventor: Clifford H. Moulton, Beaverton, Oreg.

[73] Assignee: Tektronix, Inc., Beaverton, Oreg.

[21] Appl. No.: 505,619

[22] Filed: Apr. 6, 1990

[51] Int. Cl.[5] .......................... H04B 7/00; H04B 7/42; H01F 27/28

[52] U.S. Cl. .................................. 333/12; 333/24 R; 333/26; 336/175; 336/195

[58] Field of Search .................. 333/12, 26, 25, 24 R, 333/32, 33; 336/174, 195, 221

[56]  References Cited

U.S. PATENT DOCUMENTS 2,564,881  8/1951  Cronshey et al. .............. 336/195 X
3,614,694 10/1971  Koontz ........................... 336/195 X
4,839,616  6/1989  Herzog .................................. 333/32

Primary Examiner—Thomas J. Kozma
Attorney, Agent, or Firm—William Y. Conwell

[57]  ABSTRACT

A transmission line transformer that can balance imperfectly balanced signals, and can convert a balanced input to an unbalanced output. The transformer includes two unbalanced transmission lines each having a characteristic impedance $Z_o$. The outer conductor of each is interrupted at its midpoint and is connected to the corresponding interrupted outer conductor of the other. An input signal applied across the ends of the first line's center conductor yields a balanced outer signal across the ends of the second line's center conductor. An unbalanced output can be obtained by terminating one end of the second line with an impedance $Z_o$.

5 Claims, 1 Drawing Sheet

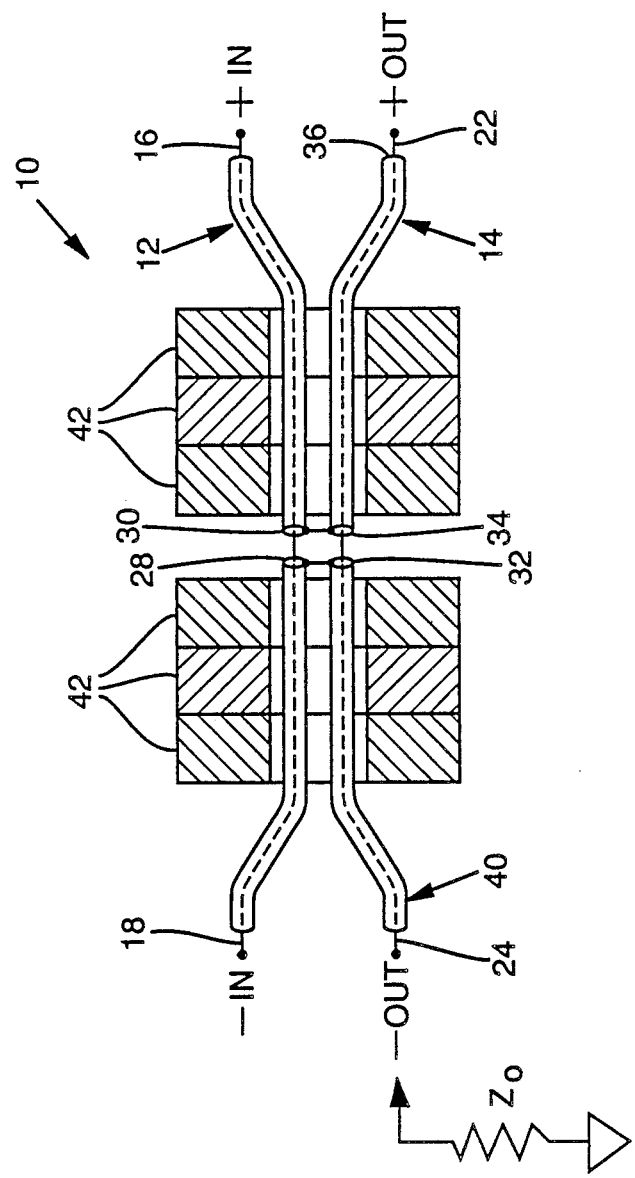

TRANSMISSION LINE TRANSFORMER

FIELD OF THE INVENTION

The present invention relates to transmission line transformers, and more particularly relates to a simple transformer useful for converting a balanced signal at an impedance $Z_0$ to a balanced or unbalanced signal at impedance $Z_0$.

BACKGROUND AND SUMMARY OF THE INVENTION

Transmission line transformers accept an input signal at an impedance $Z_{IN}$ and provide a corresponding output signal at an impedance $Z_{OUT}$. In a "balun" type transformer, one of the signals is balanced (aka push-pull) and the other is single-ended.

High speed electronic circuits, such as microwave amplifiers and sub-nanosecond logic, often employ differential circuitry, and consequently operate with push-pull input signals. However, at these high frequencies, it is very difficult to maintain a signal in a truly balanced form. Mismatches, feedback, and other disturbances tend to induce a common mode signal on any balanced line. If the circuitry to which the signal is applied is to operate optimally, the signal must be restored to a truly balanced form. Thus, there is a need for a device that will reject common mode components from a nominally-balanced signal to restore it to a balanced state.

Further, conventional signal sources provide single-ended output signals. Before such signals can be applied to push-pull circuitry, they must first be converted to push-pull form.

In accordance with the present invention, a transmission line transformer is provided that can balance imperfectly balanced signals, and that can also convert a balanced input to a single-ended output.

The foregoing and additional features and advantages of the present invention will be more readily apparent from the following detailed description, which proceeds with reference to the accompanying drawing.

BRIEF DESCRIPTION OF THE DRAWING

The Figure is a schematic illustration of a transmission line transformer according to one embodiment of the present invention.

DETAILED DESCRIPTION

Referring to the Figure, a transmission line transformer 10 according to one embodiment of the present invention includes first and second unbalanced transmission lines 12, 14, each having a characteristic impedance $Z_0$. Each of the lines has a center conductor and an outer conductor. The two ends 16, 18 of the first line 12 define a first port of the transformer, and the two ends 22, 24 of the second line 14 define a second port.

The outer conductor of each line is interrupted at its midpoint, thereby defining first and second intermediate ends 28, 30, 32, 34 of the outer conductors. The first intermediate end 28 of the first line's outer conductor is connected to the first intermediate end 32 of the second line's outer conductor. Similarly, the second intermediate end 30 of the first line's outer conductor is connected to the second intermediate end 34 of the second line's outer conductor.

Transformer 10 can be used in at least two different applications. In the first, the transformer can serve to clean up balanced signals to remove common mode signals therefrom. In this application, an imperfectly balanced input signal is applied to the transformer's first port, and the transformer acts to provide a truly balanced output version at the transformer's second port.

In the second application, the transformer can serve as a balun. In this application, a balanced signal is again applied to the first port. An unbalanced signal is then output between the center and outer conductors 22, 36 of the second line 14 at one of its two ends. The other end 40 of the second line is terminated in an appropriate matching impedance, $Z_0$.

The usable bandwidth of the transformer is limited on the lower end by the lengths of the transmission lines, and on the upper end by the size of the gap in the outer conductors. To extend the low frequency response, the transmission lines can be electrically lengthened by sheathing them in a ferrite material. In the preferred embodiment, the transmission lines each have a total length of two inches and are sheathed by a plurality of toroidal ferrite cores 42 encircling the lines.

From the foregoing, it will be recognized that the present invention advantageously provides a simple device for restoring push-pull signals to a truly balanced state, and additionally provides a readily-manufacturable balun topology for converting balanced signals into unbalanced form.

Having described and illustrated the principles of my invention with reference to a preferred embodiment thereof, it will be recognized that the invention can be modified in arrangement and detail without departing from such principles. For example, while the invention has been described and illustrated with reference to coaxial transmission lines, it will be recognized that other types of transmission lines can alternatively be used. One particularly advantageous alternate construction is to fabricate the transformer as a discrete strip line component (with interrupted ground planes), similar to the component illustrated in U.S. Pat. No. 4,821,007. Such an embodiment can readily be mass produced and can be wave soldered by automatic fabrication equipment directly to circuit boards. A number of other alternate constructions will be readily apparent to those of ordinary skill in the art.

In view of the many embodiments to which the principles of my invention may be applied, it should be recognized that the detailed embodiment is illustrative only and should not be taken as limiting the scope of my invention. Rather, I claim as my invention all such embodiments as may fall within the scope and spirit of the following claims and equivalents thereto.

I claim:

1. A transmission line transformer comprising first and second unbalanced transmission lines wherein:
    each of said lines has a center conductor and an outer conductor;
    each of said lines has a first end and a second end;
    the two ends of the first line define a balanced port of the transmission line transformer;
    one end of the second line defines an unbalanced port of the transmission line transformer;
    the outer conductor of each line is interrupted at a point midway between the first and second ends, thereby defining first and second intermediate ends of said outer conductor;
    the first intermediate end of the first line's outer conductor is connected to the first intermediate end of the second line's outer conductor; and the second intermediate end of the first line's outer conductor is connected to the second intermediate end of the second line's outer conductor.

2. The transmission line transformer of claim 1 in which the first and second unbalanced transmission lines are routed through a ferrite toroid.

3. The transmission line transformer of claim 1 in which both the first and second unbalanced transmission lines exhibit a characteristic impedance $Z_0$, and the end of the second line that does not define the unbalanced port of the transmission line transformer is terminated in an impedance $Z_0$.

4. The transmission line transformer of claim 1 in which the first and second unbalanced transmission lines are coaxial transmission lines.

5. A transmission line transformer comprising first and second transmission lines wherein:

each of said lines has a center conductor and an outer conductor;

each of said lines has a first end and a second end;

the two ends of the first line define an input port of the transmission line transformer;

the two ends of the second line define an output port of the transmission line transformer;

the outer conductor of each line is interrupted at a point midway between the first and second ends, thereby defining first and second intermediate ends of said outer conductor;

the first intermediate end of the first line's outer conductor is connected to the first intermediate end of the second line's outer conductor; and the second intermediate end of the first line's outer conductor is connected to the second intermediate end of the second line's outer conductor.

* * * * *